United States Patent [19]

Schowe

[11] Patent Number: 5,396,240
[45] Date of Patent: Mar. 7, 1995

[54] MISSING PULSE GENERATOR FOR GRAY CODE DECODING

[75] Inventor: Lester Schowe, Longmont, Colo.
[73] Assignee: Maxtor Corporation, San Jose, Calif.
[21] Appl. No.: 115,215
[22] Filed: Sep. 1, 1993
[51] Int. Cl.⁶ ............................................. H03M 7/16
[52] U.S. Cl. ........................................ 341/97; 360/51; 341/94
[58] Field of Search ................ 341/94, 96, 97, 98; 360/46, 51

[56] References Cited

U.S. PATENT DOCUMENTS

| | | | |
|---|---|---|---|
| 4,626,933 | 12/1986 | Bucska et al. | 360/51 X |
| 4,849,834 | 7/1989 | Allen | 360/46 |
| 4,876,697 | 10/1989 | Whitfield | 375/22 |
| 5,025,328 | 6/1991 | Silva | 360/46 |
| 5,115,356 | 5/1992 | Silva | 360/51 |

*Primary Examiner*—Marc S. Hoff
*Attorney, Agent, or Firm*—Blakely, Sokoloff, Taylor & Zafman

[57] ABSTRACT

This invention describes the use of a counter and digital logic to provide a timing pulse needed to decode Gray code position information on the tracks of a rotating disk storage media when the timing pulse is missing because the head of the disk drive is straddling two tracks as the Gray code passes beneath the head. The logic synchronizes the timer to provide a pulse at precisely the right time if and only if a pulse originated by the Gray code is missing.

16 Claims, 5 Drawing Sheets

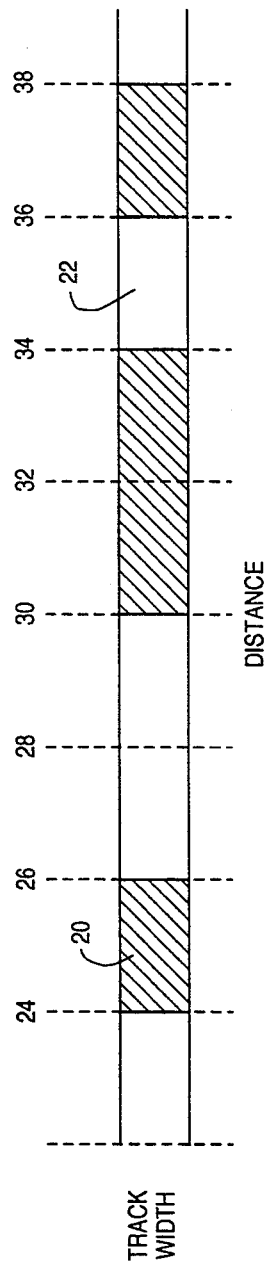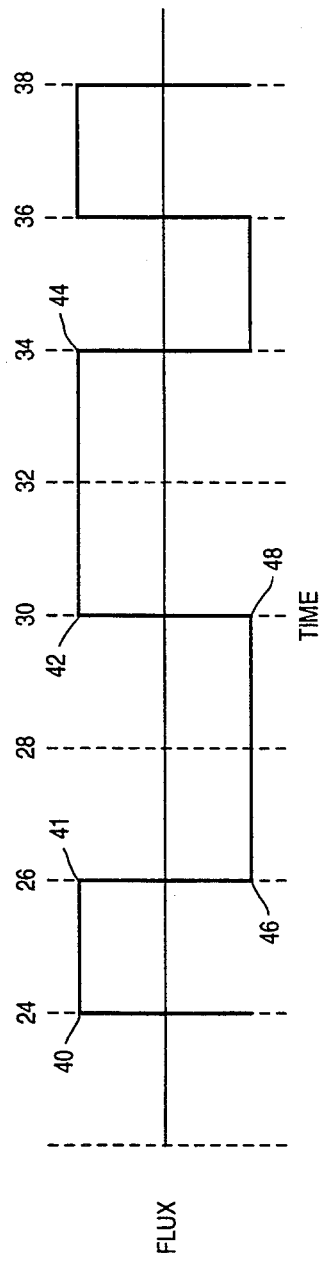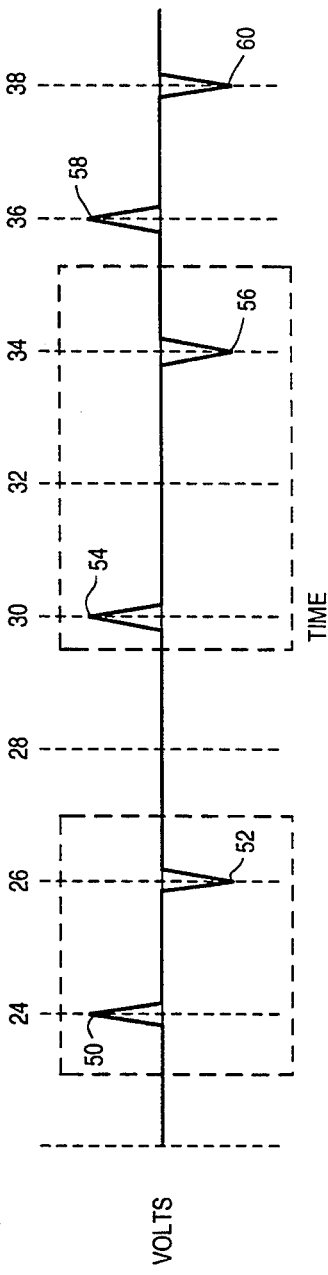

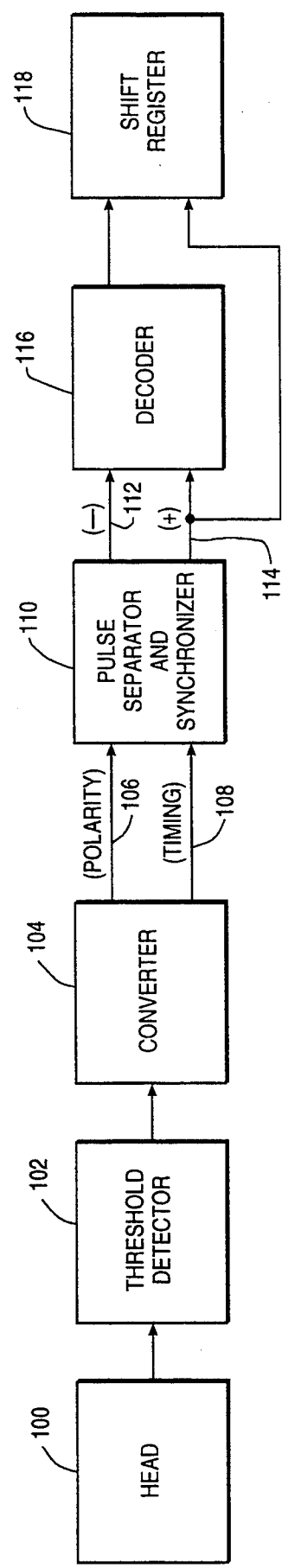
FIG_2 (PRIOR ART)

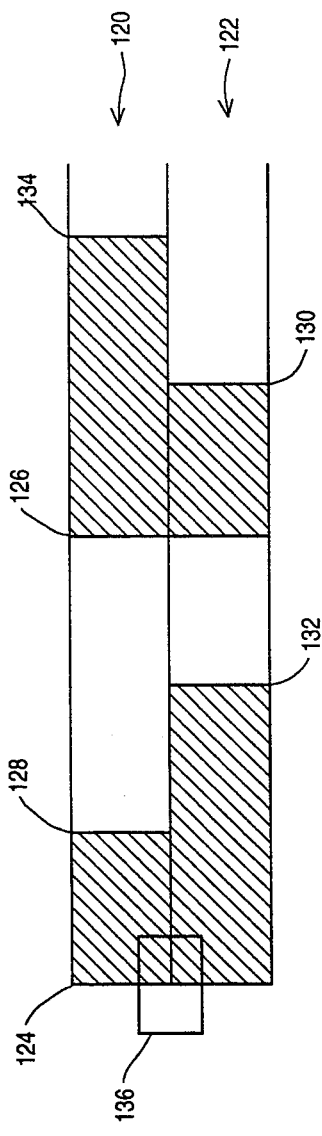
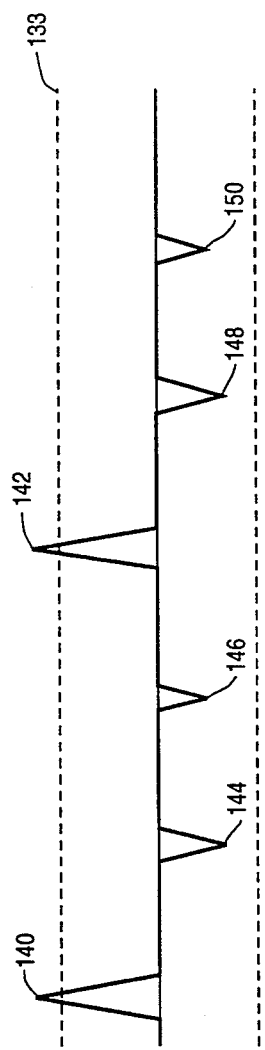
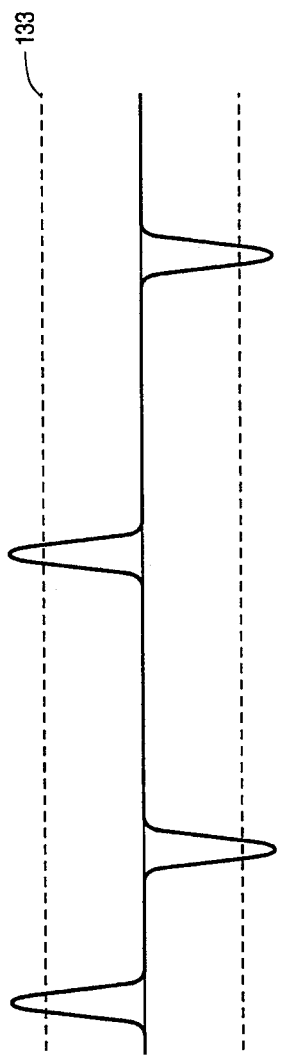

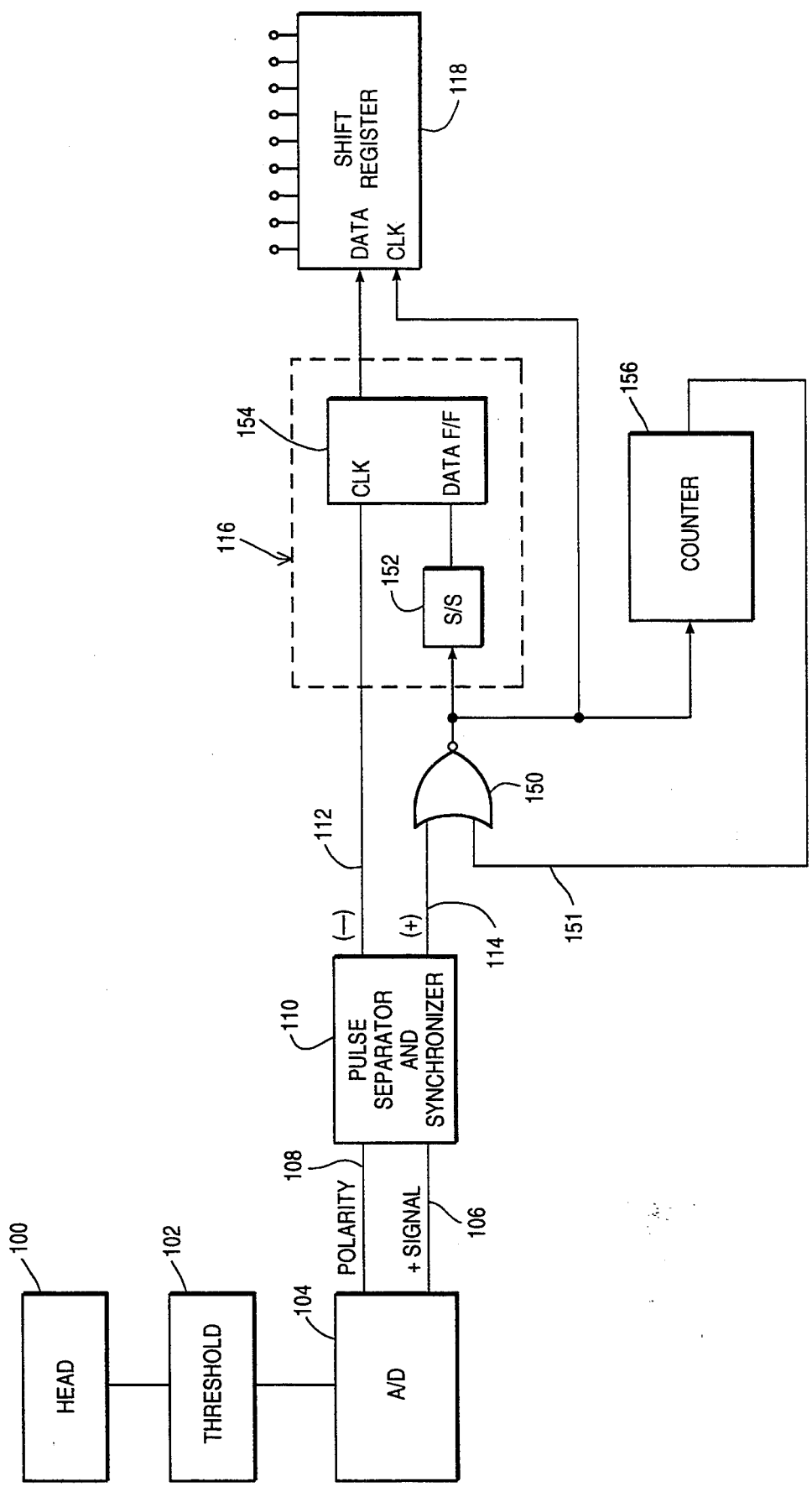

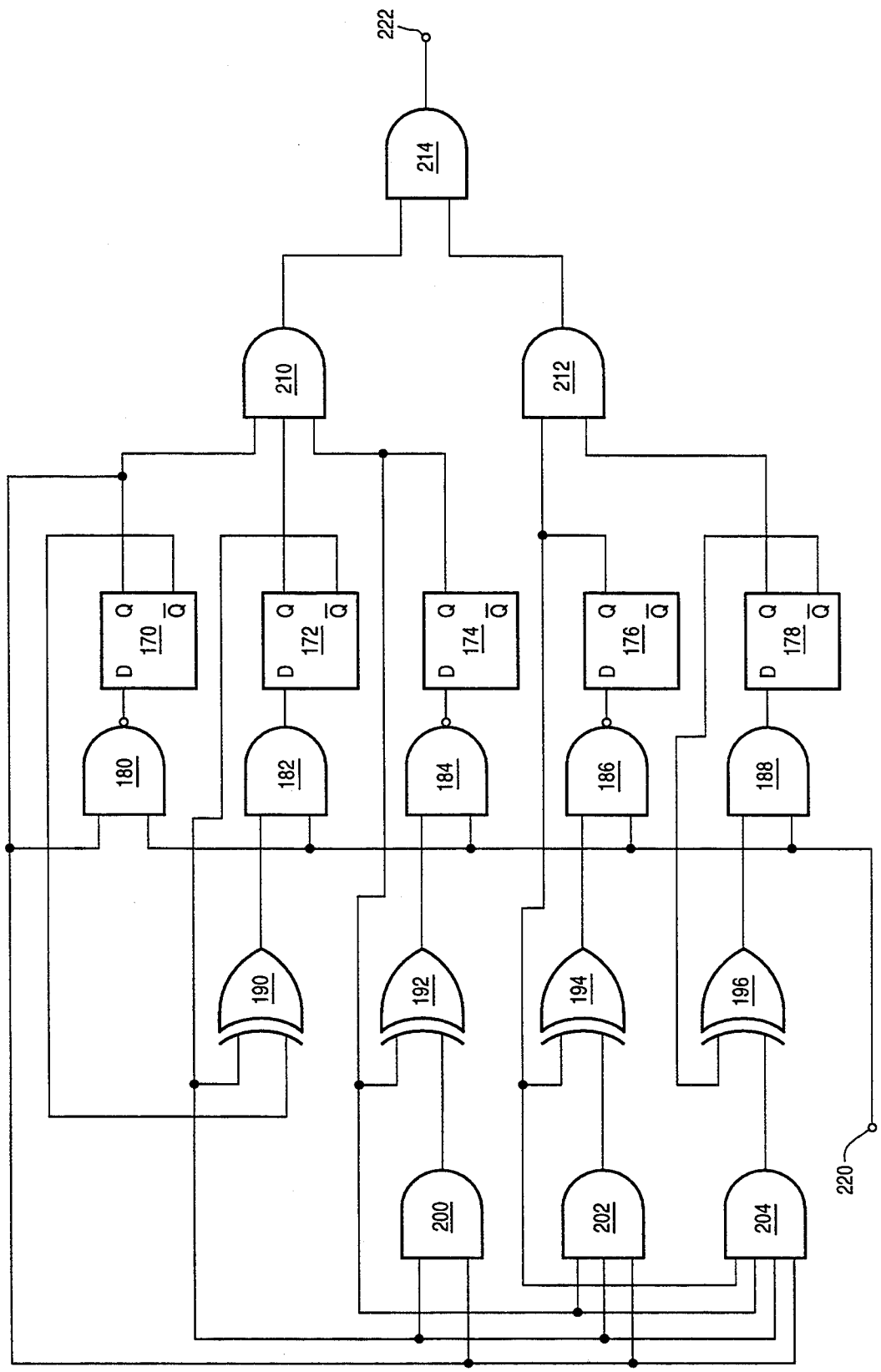

MISSING PULSE GENERATOR FOR GRAY CODE DECODING

BACKGROUND OF THE INVENTION

Field of the Invention

This invention relates to a servo system for computer disk drives. More particularly, it relates to a system for providing a pulse which is sometimes missing due to the unpredictability of the disk head as it attempts to read track position information from a rotating disk.

In the fabrication of disk drives for computers, the head of the disk drive is controlled by an embedded servo system. The position information necessary to implement the imbedded servo is encoded in hard sectors that run radially from the center of the disk to its circumference. Hard sectors are written at the time the disk is manufactured and are never changed thereafter. The hard sectors are small spoke like areas of the disk that run radially at fixed angular intervals. In contrast, user data is written on concentric tracks. In order to communicate with the disk in a useful way, the head must first find and then hover directly over a particular track. As the disk spins, the track moves approximately linearly beneath the head. As a hard sector passes under the head, it reads information that specifies which track it is over.

The track information is encoded in the hard sectors in what is known as Gray code. Gray code is widely used in input/output devices, analog to digital converters, and other peripheral equipment. In Gray code, each incremental number differs from the preceding one by only one bit. Thus, Gray is known by those in the art as a "distance one" code. In this way it minimizes errors in reading position if one bit is wrong. The Gray code is read serially as the track passes under the head and is accumulated in a shift register. It may then be read out in parallel and converted to binary and otherwise treated as a digital word.

In order for the head to identify the track information, it must know precisely where to find it. The traditional technique for doing this is to use a clock and digital logic to calculate when the head is over a hard sector and then strobe the information into a register. The problem with this approach is that the clock is often not running at precisely the same frequency as the disk. They are not locked together. Consequently a phase shift can and often does develop between where the computer thinks the Gray code starts and where it actually starts. This combined with jitter causes the head to misread bits at the end of the Gray code.

In an effort to solve this problem, a new technique was developed where the hard sectors were detected by the head itself. That is, a special gap in the magnetic domain, called the DC erase gap, indicates that the next information received will give track position in Gray code. But this technique has in turn led to the problem for which the present invention is a solution. The new technique and the problem that the present invention solves can best be understood by reference to FIGS. 1 and 2.

The encoding of the Gray code is best understood by reference to FIG. 1(a), (b) and (c). FIG. 1(a) represents a track in a hard sector. Cross hatched areas, such as area 20, represent areas that are magnetized as a north pole. All un-crosshatched areas, such as area 22, represent areas that are magnetized as south poles. The horizontal axis represents distance along the track. The vertical markers 24 through 38 are on the order of fractions of a micron apart.

Since the disk is rotating at a tightly controlled constant angular speed, each increment of distance indicated by markers 24 through 38 in FIG. 1(a) can be converted to a fixed period of time that it takes each incremental distance in FIG. 1(a) to pass a given point such as a stationary read/write head. Thus, in FIG. 1(b), the horizontal axis represents time. The vertical markers are spaced apart by the amount of time that it takes a specified length of track to pass under the head. The graph of FIG. 1(b) shows the amount of time that the head sees magnetic flux of either a north or south polarity. That is, each time an area of magnetic north passes beneath the head, the head sees a north polarity flux, such as from time 40 to 41 and 42 to 44. Each time an area of magnetic south passes beneath the head, the head sees a south polarity flux, such as between time 46 and 48.

FIG. 1(c) shows the electrical response of the head to the movement of the track beneath it. As is well known, the electric current induced in a coil passing through a magnetic field is proportional to the rate of change of magnetic flux seen by the coil.

Thus, the rapid change in flux at the edges of the square flux wave of FIG. 1(b) causes spikes 50 through 60 in voltage in the coils of the head. The polarity of the spike is dependent on which way the flux is changing. A change from a south pole to a north pole causes a positive spike and visa versa.

Gray code is encoded as follows: The Gray code that defines the location of a data track consists of a series of bits of data defining a word. Each bit consists of a cell of alternating north and south pole magnetic material. Each cell starts with the transition from a south pole to a north pole which gives a plus spike. The logical information in each bit cell is determined by the time position of the negative spike relative to the positive spike that defines the beginning of the cell. The polarity of the magnetic encoding is such that a change from a south pole to a north pole occurs at fixed distances along the track in the hard sector. Given this, positive spikes such as 50, 54 or 58 will occur at fixed intervals of time, for example every 300 nanoseconds. Then depending on the distance to the next change from north pole to south pole, a negative spike will occur either 100 or 200 nanoseconds after the positive spike. A negative spike that occurs at the first opportunity, 100 nanoseconds after the positive spike, denotes a logic 1. If the negative spike does not occur until the second opportunity, 200 nanoseconds after the positive spike, it is a logic 0. The positive spikes are synchronizing signals and the timing of the arrival of a negative spike determines the logic.

FIG. 2 shows a simplified block diagram of a decoding system. Referring now to FIG. 2, head 100 includes an electric coil that operates as a transducer between electrical and magnetic energy. In the read mode, a voltage is induced in the head as the head experiences a change in polarity of magnetic flux from the rotating disk.

Threshold detector 102 is needed to clear noise out of the data path. It does this by filtering out any voltage that are below a specified amplitude threshold value. This circuitry is necessary to the process of taking the signals from the analog domain to digital domain and is well known in the art.

Converter 104 converts the now cleaned up positive and negative spikes to digital data. On output 106, a logic 1, which is a high voltage, appears each time a spike of either polarity is received at the input. At the same time, on output 108, a logic 1 appears if the spike is positive and a logic 0 if the spike is negative.

Pulse separator and synchronizer 110 performs the function of converting the asynchronous pulses coming from converter 104 to synchronous pulses synchronized by a high frequency system clock, not shown. Pulse separator and synchronizer 110 generates two outputs 112 and 114. When a plus polarity spike is received by the head, a logic 1 will be presented to inputs 106 and 108 of pulse separator and synchronizer 110. This will create a logic 1 at output 114 and a logic 0 at output 112. When a negative spike is received by the head, a logic 0 will appear at output 106 and a logic 1 in output 108. This will create a logic 1 at output 112 and a logic 0 at output 114. Thus, a logic 1 signal on output 114 indicates the head has experienced a synchronizing spike, and a pulse on output 112 indicates that the head has experienced a negative spike.

Decoder 112 detects whether the negative pulse occurs at opportunity one or opportunity two after the synchronizing pulse. Generally, it accomplishes this by triggering a single shot circuit upon receipt of the synchronizing pulse which then times out after opportunity one but before opportunity two for the occurrence of a negative pulse. The output of Gray code decoder 116 goes to the data input of shift register 118. Synchronizing pulse 114 goes to the clock input of shift register 118. When a synchronizing pulse is received from pulse separator and synchronizer 110, it strobes the value at the output of decoder 116 into the shift register.

The problem that the present invention solves can best be understood with reference to FIG. 3 where two side by side tracks are shown at 120 and 122. Again crosshatched areas are north poles and the discontinuities between north pole and south pole regions provide the positive and negative spikes that determine Gray code. A change from a south pole to a north pole such as at 124 and 126 creates a positive spike and is a synchronizing event. Changes from south pole to north pole occur at fixed intervals. As previously explained, Gray code encoding is accomplished by having the north pole region extend either one third of the distance as at 128 and 130 or two thirds of the distance as at 132 and 134 to the next to the next mandatory change from south to north pole which is the beginning of a bit cell. If the north region extends one third of the way, it is a logic 1. If the north pole extends two thirds of the way it is a logic 0.

FIG. 3(b) shows the voltage spikes received by the head as track 120 passes precisely under the head.

FIG. 3(c) shows the voltage spikes received by the head if the head is positioned partially over track 120 and partially over track 122. In this case the location of the head is indicated by reference numeral 136. At locations 124 and 126 the entire head sees a change from south to north pole which results in positive spikes 140 and 142. Both of these spikes are above threshold voltage level 133. In contrast, at locations 128, 132, 130 and 134, only approximately one half of the head sees a change in flux. This provides spikes 144, 146, 148 and 150 that have amplitudes approximately half as high as the case where the entire head sees a change of flux. And these pulses do not reach the threshold voltage amplitude 133. Thus a negative pulse does not occur.

And since the circuitry requires that there cannot be two plus pulses in a row, the next plus pulse does not occur. This is the missing pulse.

A missing plus pulse can occur from defects; but it also occur in the normal operation of the disk. This latter condition occurs when the read or write command causes the head to move radially across tracks. Thus, as a hard sector comes under the head as the head is moving to a new track, some percentage of the time, the head will actually be over portions of two tracks so that the condition previously explained with respect to FIG. 3 will occur.

SUMMARY OF THE INVENTION

The present invention is a circuit for providing one and only one synchronizing pulse to a Gray code decoder and shift register accumulator. The invention operates in a disk drive data storage device which includes a head for data transfer to and from a data disk and upon which position information has been encoded so that the head may locate and maintain a desired position relative to the data disk, by a system that includes in combination a threshold detector connected to the head for passing pulses that exceed a predetermined threshold amplitude, an analog to digital converter for converting a train of positive and negative spikes from the threshold detector to digital pulses on two outputs one for each spike of either polarity detected and a second output that identifies the spike as either positive or negative. A synchronizer means is connected to the threshold detector and converts asynchronous pulses to synchronous pulses. The output of the synchronizer consists of a timing pulse and a polarization pulse. A decoder is connected to the synchronizer and decodes the position information as it passes beneath the head. The decoded position information is then strobed serially into a shift register.

In the present invention, a missing pulse generator is added to the disk drive control circuitry. The missing pulse generator monitors the arrival of synchronizing pulses created by the beginning of a bit cell on the data disk. If such pulse is missing due to the possibility that the head will be straddling two tracks as it attempts to read position information, the missing pulse generator provides the missing pulse. However, timing is arranged such that only one and only one pulse will be generated by the missing pulse generator for each missing pulse caused by the head location over the disk.

It is an object of this invention to provide a method and apparatus for creating a synchronizing pulse when one is missing at the input to the Gray code decoder and the clock input to the shift register.

It is a further object of this invention to insure that one and only one synchronizing pulse is supplied to the Gray code decoder and shift register for each bit cell passing under the head.

These and other objects of the invention may be achieved through use of the present invention which will now be more fully described in connection with the Drawing.

BRIEF DESCRIPTION OF THE DRAWING

The present invention will be described in more detail in connection with the Drawing, wherein:

FIG. 1(a) relates to the background of the invention and depicts a section of track on a rotating magnetic information storage disk with regions of magnetic north and south pole material.

FIG. 1(b) relates to the background of the invention and shows the magnetic flux corresponding to the track of FIG. 1(a).

FIG. 1(c) relates to the background of the invention and shows the electrical signal induced in the head as the track of FIG. 1(a) passes thereunder.

FIG. 2 relates to the background of the invention and shows a block diagram of a prior art system for detecting the track location information encoded in each track.

FIG. 3(a) relates to the problem to be solved by the present invention and depicts a section of two contiguous tracks with the head in position partially over both tracks which creates the problem solved by this invention.

FIG. 3(b) relates to the problem to be solved by the present invention and shows voltage spikes of the head as one of the tracks passes directly beneath it.

FIG. 3(c) relates to the problem to be solved by the present invention and shows the signal induced in the head as the track configuration of FIG. 3(a) passes beneath it.

FIG. 4 is a block diagram of a system for decoding the encoded track location information that includes a missing pulse generator in accordance with the present invention.

FIG. 5 is a schematic of a preferred embodiment of the counter portion of the missing pulse generator.

DETAILED DESCRIPTION OF THE INVENTION

FIG. 4 is a block diagram of the decoding system including the invention. Referring now to FIG. 4, head 100, threshold detector 102, converter 104 and pulse separator and synchronizer 110 are as described in connection with FIG. 2.

According to the invention, a NOR gate 150 is connected between pulse separator and synchronizer 110 and decoder 116. Plus output 114 of pulse separator and synchronizer 110 is supplied to one input of NOR gate 150. The output of NOR gate 150 is supplied to the input of single shot circuit 152. Upon receipt of an input signal, single shot 152 generates a fixed pulse width output signal for a certain number of system clock counts. The number of counts is chosen so that single shot 152 times out and goes to 0 after the first opportunity for a negative spike and before the second opportunity for a negative spike. The output of single shot 152 goes to the data input (D) of data flip flop 154. The clock input to flip flop 154 is connected to the minus output 112 of pulse separator and synchronizer 110. If the pulse on minus output 112 comes before single shot 152 has timed out, the output of flip flop 154 will be positive since the output of single shot 152 will still be at a logic 1 level, i.e. the voltage is high. If the pulse on minus output 112 comes after the single shot has timed out, the output of flip flop 154 will be 0 which is a logic 0 since single shot 152 will have timed out and its output will be at a logic 0 level, i.e. 0 volts.

Reference numeral 118 refers to a conventional shift register with a data and clock input and an 8 pin parallel output. Data is strobed into the shift register serially and read out in parallel. The output of flip flop 154 is connected to the data input of shift register 118. The clock input to data register 118 is connected to the output of NOR gate 150. Thus each time there is a signal on the output of NOR gate 150, the Gray code information from flip flop 154 is strobed into shift register 118 one bit at a time.

If however, a plus pulse does not arrive, then there is no clock pulse to shift register 118. This causes shift register 118 not to shift and an order of magnitude error (factor of 2 base 10) in the output of shift register 118 which provides a random track number and thus makes the disk totally unworkable.

Counter 156 in conjunction with NOR gate 150 solves this problem by providing an output pulse at precisely the correct time interval after receipt of the last synchronizing pulse from output 114. This pulse is supplied to input 151 of NOR gate 150. The output of NOR gate 150 then supplies the missing synchronizing pulse to shift register 118. Counter 156 may be either an up counter or a down counter. In the preferred embodiment it is a synchronous up counter.

If the head is positioned directly over a track, a synchronizing pulse will occur on time at output 114 of pulse separator and synchronizer 110. This pulse will cause the output of NOR gate to be low, i.e. at a 0 voltage level. The appearance of this state at the input to counter 156 effectively synchronizes counter 156 with the rotation of the disk and starts the count sequence that leads to an output signal a specified number of clock counts later. The number of clock counts is chosen such that the output of counter 156 occurs exactly when the next plus pulse should occur, but delayed by one or more system clock counts.

The delay is important since it insures that the system will not put out two synchronizing pulses instead of one. This could happen if counter 156 fired exactly on time but the synchronizing pulse from output 114 came late. Coming late is possible since in the conversion from an asynchronous system to a asynchronous system, the asynchronous pulse may not arrive precisely on the leading edge of a clock pulse. And if it arrives later, it will not be synchronized until the next leading edge of the clock. Thus the arrival of the synchronizing pulse on output 114 will vary over a narrow range of clock pulses. To ensure that two synchronizing pulses are not sent to shift register where only one is needed, the output from counter 156 is delayed. A delay of a few system clock counts does not affect the operation of shift register 118 since the system clock is very much faster than the frequency of arrival of track originated synchronizing pulses.

While the output of counter 156 in FIG. 4 is connected to both the input to NOR gate 150 and to shift register 118, the invention would still be effective if only the output of counter 156 is connected to shift register 118. If this arrangement were used, there would be a 50% chance of having the bit value wrong, but shift register 118 would be shifted and the orders of magnitude would be accurate. And since in Gray code, a change in one bit indicates a movement of one track position, the error due to the inaccuracy of this one bit would be very small.

The counter of FIG. 5 is a preferred embodiment of counter 156 of FIG. 4. It is a 5 bit synchronous (clock not shown) up counter consisting of D flip flops 170, 172, 174, 176 and 178; exclusive OR gates 190, 192, 194 and 196 and AND gates 200, 202 and 204. In this configuration, flip flop 170 is the least significant bit. Exclusive OR gates 190, 192, 194 and 196 and AND gates 200, 202 and 204 are connected between either the Q output or the not-Q output of one flip flops to the input of another in a conventional way to provide place value.

That is, flip flop 170 switches state on each clock count; flip flop 172 switches from a 0 to a 1 on the second clock pulse, etc. When all flop flops are in a 1 state, a value 1F in hexadecimal, the counter starts over with all flip flops in the 0 state.

The D input to each of the flip flops is connected to the output of NAND gate 180, AND gate 182, NAND gate 184, NAND gate 186 and AND gate 188 respectively. These gates are present to load a particular value from which to start counting since the full 32 counts of which the counter is capable of counting is not desired. For example, when load input 220 goes to 0, the output of AND 188 is 0 and of NAND gate 186 is 1, of NAND gate 184 is 1, of AND gate 182 is 0 and of NAND gate 180 is 1. This effectively loads the counter with a hexadecimal 0D. On the next clock pulse, the counter will start counting up from the load input state. This state is chosen such that the time period will be exactly the time period between synchronizing pulses plus one clock count.

The counter output is decoded by AND gates 210, 212 and 214. (A single 5 input AND gate is an alternative embodiment of the counter output decoder). The inputs to AND gates 210 and 212 are connected to the Q outputs of flip flops 170, 172, 174, 176 and 178. The outputs of AND gates 210 and 212 go to a 1 state when their inputs are all in a 1 state. The outputs of AND gates 200 and 202 are in turn connected to the inputs of AND gate 214. When the two inputs to AND gate are in a 1 state, the output 222 goes to a 1 state. Thus, in operation, output 222 to counter 156 remains at a 0 state until all outputs Q on flip flops 170, 172, 174, 176 and 178 are in a 1 state. At that time, a positive pulse one clock period wide appears at output 222. This pulse takes the place of the missing synchronizing pulse. As such, it strobes shift register 118 and causes load input 220 to go low again which in turn initializes the counter just as the synchronizing pulse would have done had it been present. The sequence may then repeat.

While the invention has been described in connection with one particular embodiment, those skilled in the art will understand that other embodiments are possible and that the invention is limited only by the attached claims.

What is claimed is:

1. In an apparatus for decoding position information encoded in a hard sector on a track of a rotating information storage disk as said track passes beneath a head for data transfer to and from said disk and wherein the unpredictable location of said head with respect to said track causes synchronizing pulses to be missing, said apparatus further including threshold detector coupled to said head for passing voltage spikes indicative of said position information from said head that exceed a predetermined amplitude threshold, a converter for converting positive and negative spikes to digital asynchronous pulses, a synchronizer coupled to said threshold detector for converting said asynchronous pulses to synchronous pulses, the output of said synchronizer including a synchronizing pulse and a polarity pulse, a decoder coupled to said synchronizer for decoding said position information, and a for storing said decoded position information, said register being shifted by said synchronizing pulse, an improvement comprising:

a missing pulse generator having an input coupled to an output of said synchronizer and having an output coupled to said register and said decoder, said missing pulse generator being adapted to provide a pulse to said register a predetermined time after receipt or a synchronizing signal such that said register shifts.

2. The apparatus of claim 1 wherein said missing pulse generator includes:

a logic gate having a first input connected to the synchronizing output of said synchronizer, and second input, said logic gate being adapted to provide an output if a signal is present on either of said first or second inputs; and a counter having an input connected to the output of said logic gate the output of said counter being connected to said second input of said logic gate, said counter providing an output pulse a predetermined time after receipt of a signal on said input of said counter.

3. The apparatus of claim 2 wherein said logic gate consists of a NOR gate.

4. The apparatus of claim 3, wherein said counter is an up counter.

5. The apparatus of claim 4 wherein said up counter includes logic for initializing said counter with a count such that said counter times out at a number smaller than the maximum count of said counter.

6. The apparatus of claim 2 wherein said logic gate is an OR gate and wherein said counter is a down counter.

7. The apparatus of claim 1 wherein said predetermined time consists of the period between the appearance of said hard sectors under said head plus a predetermined incremental time.

8. The apparatus of claim 7 wherein said incremental time consists of one system clock count.

9. In a system for decoding information encoded in bit cells periodically on a track of a rotating information storage disk as said track passes beneath a head for data transfer to and from said disk and wherein the unpredictable location of said head with respect to said track causes synchronizing pulses to be missing, said apparatus further including a head for data transfer to and from a data disk upon which position information has been encoded, a system for decoding information and accumulating said information comprising:

a threshold detector connected to said head for passing voltage spikes received by said head relating to said bit cells that exceed a predetermined amplitude threshold;

a converter circuit connected to said threshold circuit for converting said spikes to digital asynchronous pulses;

a synchronizing circuit connected to said converter circuit for converting said asynchronous pulses to synchronous pulses, the output of said synchronizing circuit including a timing pulse and a polarity pulse;

a decoder circuit connected to said synchronizing circuit for decoding said information;

a shift register connected to said decoder circuit for storing said decoded information; and a missing pulse generator connected between said synchronizing circuit and said shift register said missing pulse generator being adapted to provide a pulse to said shift register a predetermined time after receipt of a synchronizing signal from said synchronizing circuit such that said shift register shifts;

said missing pulse generating including:

a logic device having a first input connected to the synchronizing output of said synchronizing circuit and second input, said logic device being adapted to provide an output if a signal is present on either of said inputs; and a counter having its input connected to the output of said logic device and its output connected to the second input of said logic device, said counter being adapted to provide an output pulse a predetermined time after receipt of a signal on the input thereof.

10. The apparatus of claim 9 wherein said decoder circuit comprises:

a single shot circuit having its input connected to said logic device;

a flip flop operatively connected to the output of said single shot and to the minus output of said synchronizing circuit and its output connected to the data input of said shift register, said flip flop being adapted to provide a logic 1 output if a signal is received from said synchronizing circuit prior to the timing out of said single shot circuit.

11. The apparatus of claim 10 wherein said flip flop is a d-flip flop having its d-input connected to the output of said single shot, its clock input is connected to the minus output of said synchronizing circuit and its output connected to the data input to said shift register.

12. The apparatus of claim 9 wherein said logic device comprises a NOR gate.

13. The apparatus of claim 12, wherein said counter is an up counter.

14. The apparatus of claim 13 wherein said up counter includes logic for initializing said counter with a count such that the counter times out at a number smaller than the maximum count of said counter.

15. The apparatus of claim 9 wherein said predetermined time consists of the period between synchronizing pulses plus a predetermined incremental time.

16. The apparatus of claim 15 wherein said incremental time consists of one system clock count.

* * * * *